United States Patent
Hammi

(10) Patent No.: US 9,214,969 B2
(45) Date of Patent: Dec. 15, 2015

(54) SCALABLE DIGITAL PREDISTORTION SYSTEM

(71) Applicant: KING FAHD UNIVERSITY OF PETROLEUM AND MINERALS, Dhahran (SA)

(72) Inventor: Oualid Hammi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 14/522,508

(22) Filed: Oct. 23, 2014

(65) Prior Publication Data

US 2015/0043678 A1 Feb. 12, 2015

Related U.S. Application Data

(63) Continuation-in-part of application No. 13/891,134, filed on May 9, 2013, now abandoned.

(51) Int. Cl.
*H04B 1/04* (2006.01)
*H03F 1/32* (2006.01)
*H03F 1/02* (2006.01)

(52) U.S. Cl.
CPC ............ *H04B 1/0475* (2013.01); *H03F 1/0288* (2013.01); *H03F 1/3247* (2013.01); *H03F 1/3258* (2013.01); *H03F 2201/3233* (2013.01); *H04B 2001/045* (2013.01); *H04B 2001/0425* (2013.01)

(58) Field of Classification Search
CPC .................... H04B 1/0475; H04B 2001/0425; H03F 1/3241; H03F 1/3247; H03F 1/3258
USPC ........................................... 375/297; 330/149
See application file for complete search history.

(56) References Cited

U.S. PATENT DOCUMENTS

| | | | | |
|---|---|---|---|---|
| 5,929,703 A * | 7/1999 | Sehier | ................... | H03F 1/3247 330/149 |
| 6,903,604 B2 * | 6/2005 | Kim | ...................... | H03F 1/3247 330/149 |
| 7,333,559 B2 | 2/2008 | Song et al. | | |
| 7,577,211 B2 | 8/2009 | Braithwaite | | |
| 2004/0179629 A1 | 9/2004 | Song et al. | | |
| 2005/0195919 A1 | 9/2005 | Cova | | |
| 2014/0254716 A1 * | 9/2014 | Zhou | ..................... | H03F 1/3247 375/296 |

FOREIGN PATENT DOCUMENTS

WO WO 2009/125323 A1 10/2009

OTHER PUBLICATIONS

Oualid Hammi et al., "Bandwidth and Power Scalable Digital Predistorter for Compensating Dynamic Distortions in RF Power Amplifiers", IEEE Transactions on Broadcasting, (Jun. 12, 2013), vol. 59, Iss. 3, pp. 520-527.

* cited by examiner

*Primary Examiner* — Betsy Deppe
(74) *Attorney, Agent, or Firm* — Richard C Litman

(57) ABSTRACT

The scalable digital predistortion system and method provides compensation for the nonlinear distortions of power amplifiers and transmitters. The scalable digital predistortion system and its associated update algorithms provide scalability in terms of signal bandwidth and average power, allowing for low complexity updates following changes in the signal's bandwidth and/or power level. The method applies both memory polynomial functions and memoryless predistortion functions for compensating for the nonlinear distortions.

5 Claims, 8 Drawing Sheets

SCALABLE DIGITAL PREDISTORTION SYSTEM

CROSS-REFERENCE TO RELATED APPLICATION

This application is a continuation-in-part of U.S. patent application Ser. No. 13/891,134, filed on May 9, 2013.

BACKGROUND OF THE INVENTION

1. Field of the Invention

The present invention relates to circuits for predistortion of digital signals, and particularly to a scalable digital predistortion system for linearizing a power amplifier for a radio communication transmitter.

2. Description of the Related Art

Baseband digital predistortion (DPD) implements, in the digital baseband domain, a nonlinear function that is complementary to that of the radio frequency (RF) power amplifier such that the cascaded system made of the DPD and the amplifier behaves as a linear amplification system. Even though it may seem conceptually straightforward, digital predistortion systems are quite tricky to design, since they require a perfect match between the amplifier's nonlinear behavior and the predistorter's nonlinear function. In fact, any mismatch between the two nonlinear functions will limit the performance of the DPD system and result in residual distortion. Accordingly, it is essential to understand the behavior of the power amplifier in order to design a low complexity, high performance digital predistortion system.

The power amplifiers' nonlinear behavior, which is expressed in terms of their AM/AM and AM/PM characteristics, is sensitive to the operating conditions. These conditions may vary on a long-term scale, as it is in the case of the biasing drifts and aging effects, or on a short-term scale, such as the changes in the drive signal characteristics. For a given transmission standard, the changes in the operating signal conditions mainly affect the signal's average power and/or its bandwidth. Such changes occur frequently and require a quick update of the predistorter function. However, predistorter functions usually contain a large number of coefficients for accurate linearization. In fact, in modern communication systems, wideband signals with high peak-to-average power ratio are transmitted. This emulates a dynamic, nonlinear behavior of the PA characterized by the presence of static distortion and memory effects. This requires the use of advanced digital predistorter structures that can compensate for dynamic nonlinear distortions. Several predistorter models have been reported in the literature. These include the Volterra series and their reduced versions, neural networks, memory polynomial-based predistorters, twin-nonlinear two-box structures, as well as Wiener- and Hammerstein-type predistorters. These models often result in a large number of coefficients to be identified. It is therefore important to develop scalable digital predistorter structures that can easily track changes in power amplifier behavior to ensure optimal performance.

Thus, a scalable digital predistortion system solving the aforementioned problems is desired.

SUMMARY OF THE INVENTION

The scalable digital predistortion system uses a behavioral model that models and compensates for the nonlinear distortions of power amplifiers and transmitters. The predistortion and update algorithms make the model/DPD scalable in terms of signal bandwidth and average power, allowing for low complexity update following changes in the signal's bandwidth and/or power level. Experimental validation performed on a 300 Watt Doherty power amplifier shows that the scalable model, as well as the predistorter architecture, achieves performance similar to their conventional counterpart. However, the proposed model/predistorter requires the update of up to 50% fewer coefficients than the conventional model/predistorter.

When a signal is initially received, an average power of the signal is estimated. This may be performed by receiving L samples of the signal, measuring the power of each of the L samples, and averaging the L measured powers. It should be understood that any power-averaging technique may be used, as is well known in the art. Similarly, a bandwidth of the signal is measured, which may be accomplished by any conventional bandwidth measuring technique, as is well known in the art. A memory look-up table bank is stored in computer readable memory, and the memory look-up table bank includes sets of parameters associated with a memory polynomial function. Preferably, these parameters are the nonlinearity order and the memory depth, and are indexed in the memory look-up table bank by bandwidth. The measured bandwidth is used to determine the nonlinearity order and the memory depth of the memory polynomial function. The input signal is applied to the memory polynomial predistortion function to generate a first modified signal.

From the first average power, a first memoryless predistortion function associated with the estimated first average power of the signal is determined, based upon a memoryless look-up table bank, which stores a set of memoryless predistortion functions indexed by average power values. The memoryless look-up table bank is stored in computer readable memory. The first memoryless predistortion function from the memoryless look-up table bank is applied to the first modified signal to generate a second modified signal. Specifically, the signal sample at the output of the memoryless look-up table bank is calculated by multiplying the signal sample at the input of the memoryless look-up table bank by the memoryless predistortion complex gain read from the memoryless look-up table bank. The signal sample at the output of the memoryless look-up table bank is converted from digital to analog and up-converted around the RF carrier frequency before being applied at the input of the power amplifier to produce the final output of the amplifier.

A portion of the power amplifier output is fed back to update the memory polynomial predistortion function, if needed. This portion is first frequency down-converted, then digitized (i.e., converted from analog to digital). A set of coefficients of the memory polynomial function based on the nonlinearity order, the memory depth, the signal at the input of the memoryless look-up table bank and the amplified signal are then estimated. With the coefficients, the memory depth and the nonlinearity order, the memory polynomial function is a completely defined function and can then to be applied to the signal to generate the first modified signal. At the initialization stage, the memory polynomial function is set to the identity function (i.e., the output is the same as the input).

With regard to estimation of the coefficients of the memory polynomial function, any suitable technique may be used, such as the Moore-Penrose pseudo-inverse technique, or such algorithms as the least mean square (LMS) algorithm and its variants, or the recursive least square (RLS) algorithm and its variants.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
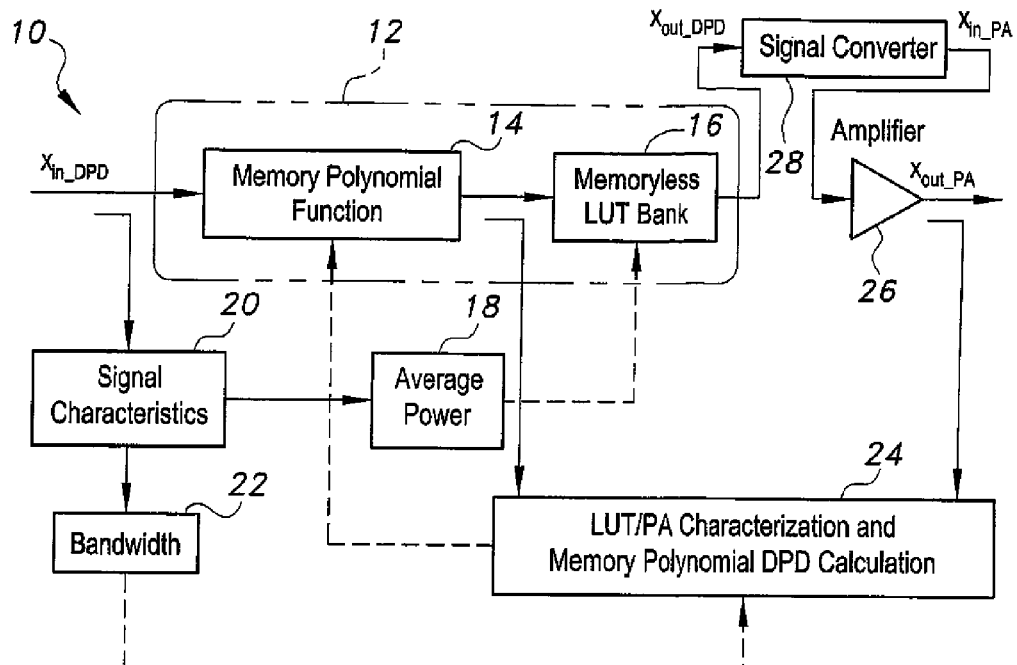
FIG. 1 is a block diagram of a scalable digital predistortion system according to the present invention.

At the outset, it should be understood by one of ordinary skill in the art that embodiments of the present predistortion system can comprise electronic circuitry, software or firmware code executing on a computer, a microcontroller, a microprocessor, or a DSP processor; state machines implemented in application specific or programmable logic; or numerous other forms without departing from the spirit and scope of the present system. The present system can wholly, or in part, be provided as a computer program, which includes a non-transitory machine-readable medium having stored thereon instructions that can be used to program a computer (or other electronic devices) to perform a process according to the functionality described herein. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of media or machine-readable medium suitable for storing electronic instructions.

The scalable digital predistortion system provides a behavioral model that models and compensates for nonlinear distortion in power amplifiers and transmitters. The predistorter includes update algorithms, which make the model/DPD scalable in terms of signal bandwidth and average power, thereby allowing for low complexity update following changes in the signal's bandwidth and/or power level.

The present scalable digital predistortion system is used mainly for digital predistortion applications. However, the same approach can be applicable for behavioral modeling applications. The technique is described for the case of the reverse twin-nonlinear two-box digital predistorter. Yet, it can be applicable for any predistorter or behavioral model structure made of the combination of a memoryless nonlinearity and a dynamic linear or nonlinear function.

Since the memoryless nonlinearity is mainly a function of the signal's average power and quasi-insensitive to the signal's bandwidth, in the present structures, the memoryless nonlinearity is indexed by the signal's average power and can be pre-calculated and saved in a look-up table bank, for example. The dynamic distortions are then identified from measured data.

Two-box architectures where the dynamic distortions are placed upstream of the memoryless distortions are more suitable for predistortion applications, as they simplify the signal de-embedding process. Similarly, two-box architectures where the memoryless distortions are placed upstream of the dynamic distortions are more appropriate for behavioral modeling applications.

In predistortion applications, the signal characteristics (average power and bandwidth) are sensed. The average power is used to select the appropriate memoryless predistortion function from a set of pre-defined look-up tables (or any other implementation of memoryless predistortion functions). The information about the signal bandwidth is used to select the parameters of the function representing the dynamic distortions. In case of a memory polynomial function, the parameters refer to the nonlinearity order and memory depth. In the present system, in the case of two-box models with the dynamic distortions being placed upstream of the memoryless distortions, the characterization of the device under test is performed using the signal at the input of the memoryless predistorter function and the signal at the output of the amplifier. This has two effects. First, it will allow for compensating any imperfections due to the memoryless predistorter function. Second, it will directly provide the signals that can be used to identify the coefficients of the dynamic distortions functions without any need for data de-embedding.

This illustrates the suitability of the reverse twin-nonlinear two-box model for the present scalable digital predistortion technique. Indeed, it does not require any de-embedding to get the input and output of the memory polynomial sub-function, which would be needed if other two-box models were used.

The scalable DPD system 10, shown in FIG. 1, accepts an input signal to the predistorter block 12. It will be understood that the predistorter block 12 may be implemented, e.g., in software executing on at least one digital signal processor. The predistorter block 12 includes a memory polynomial function generator 14 that has an output to a memoryless look-up table (LUT) bank 16. The memoryless LUT bank 16 contains a set of pre-calculated memoryless LUTs and feeds the signal convertor 28. The signal convertor 28 (the signal convertor is a circuit including a digital-to-analog converter and a frequency converter to modulate the output signal of the predistorter block 12 around the RF carrier) generates the analog signal at the RF frequency and feeds the RF amplifier 26. A portion of the output of the amplifier 26 feeds a LUT/Power Amplifier (PA) characterization and memory polynomial DPD calculation unit 24. An input signal characterizes 20 takes a portion of the input signal and characterizes the bandwidth 22 and average power 18. The bandwidth information 22 is fed to the DPD calculation unit 24. The output of the DPD calculation unit 24 is fed back to the Memory Polynomial function generator 14 to adjust its parameters and coefficients. A feedforward path is also provided from the function generator 14 to the DPD calculator 24. Additionally, the Average Power 18 is fed to the Memoryless LUT Bank 16, where the LUTs contained therein are indexed by the signal's average power. Thus, depending on the input signal's average power, a specific memoryless LUT will be selected in the Bank 16.

Experimental validation performed on a 300-Watt Doherty power amplifier shows that the scalable model, as well as predistorter architecture, achieve performance similar to their conventional counterpart. However, the proposed model/predistorter requires the update of up to 50% fewer coefficients than the conventional model/predistorter.

Figure 2:
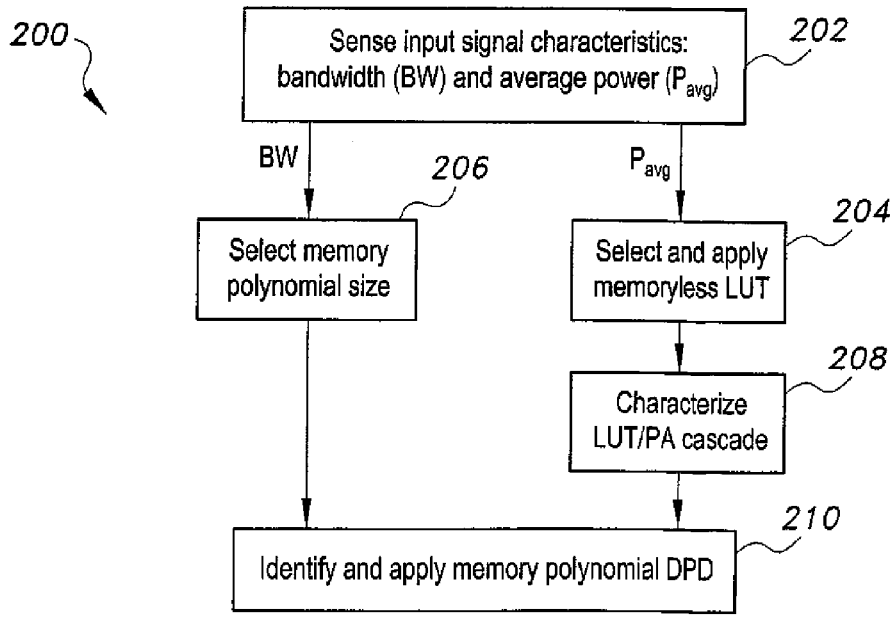
FIG. 2 is a flowchart of the identification steps of the scalable digital predistortion system according to the present invention.

As shown in FIG. 2, the logic flow 200 includes a bandwidth and average power characteristics sensing step 202, wherein the bandwidth feeds a memory polynomial size selection step 206 and the average power feeds a memoryless LUT selection and application step 204, after which the LUT/PA cascade is characterized at step 208. Results of the memory polynomial size selection step 206 and the LUT/PA cascade characterization step 208 are fed to the memory polynomial DPD identification and application step 210.

Figure 3:
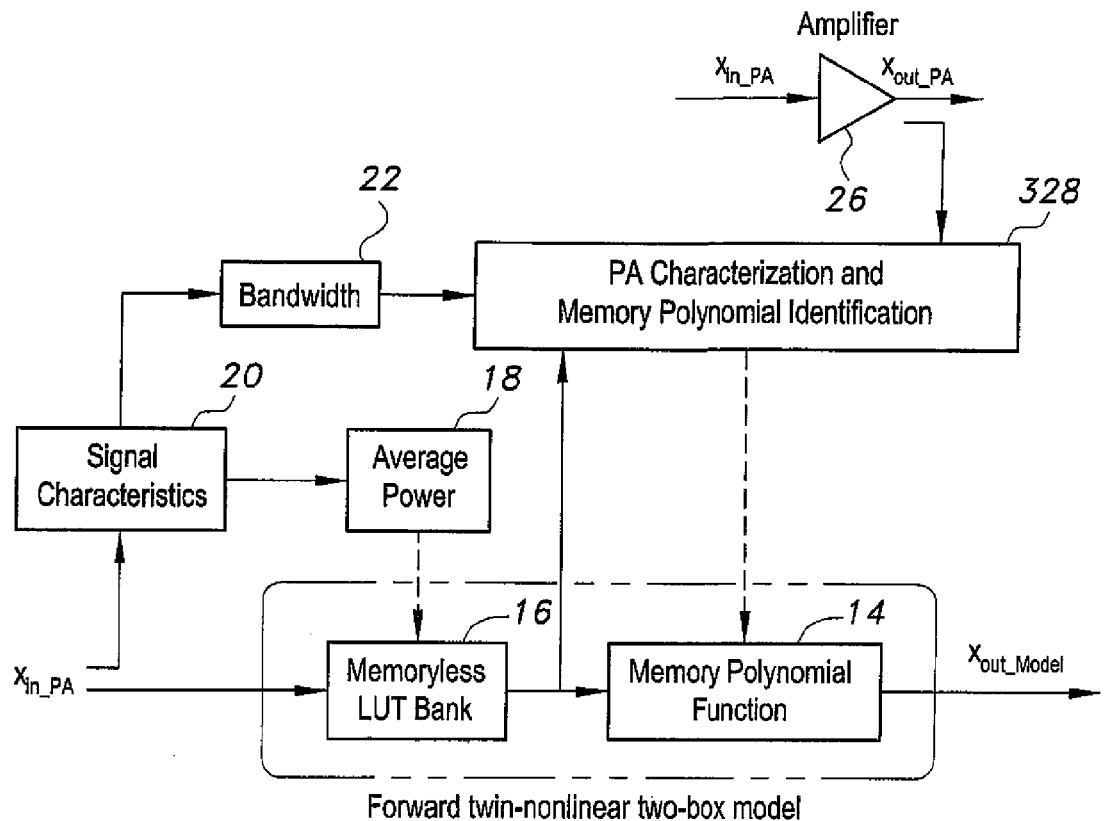
FIG. 3 is a block diagram of a scalable behavioral model.
Figure 4:
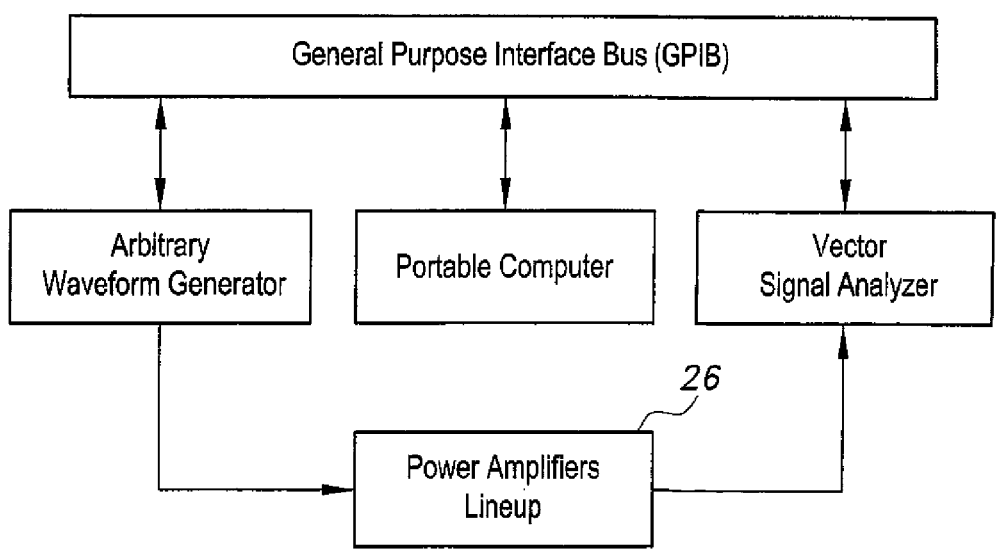
FIG. 4 is a block diagram of the experimental setup for testing a scalable digital predistortion system according to the present invention.

As shown in FIG. 3, another embodiment is obtained when the scalable model is operated as a behavioral model within the context of a forward twin-nonlinear two-box model. From the input signal, a signal characterizer 20 feeds the average power information 18 to the memoryless LUT Bank 16, which is part of a forward twin-nonlinear two-box block. The memoryless LUT Bank 16 feeds its output signal to a PA characterization and memory polynomial identifier 328. The signal characterizer 20 also feeds the bandwidth information 22 to the PA characterization and memory polynomial identifier 328. The amplifier 26 feeds its output signal to the PA characterization and memory polynomial identifier 328. The PA characterization and memory polynomial identifier 328 feeds the memory polynomial function generator 14. Within the forward twin-nonlinear two box block, the LUT bank 16 also feeds the memory polynomial function generator 14, which has an output signal, $x_{out\_Model}$. The present system 10 can be tested using a bus-connected arbitrary waveform generator, a portable computer, and a vector signal analyzer, as shown in FIG. 4.

The flowchart summarizing the identification steps of the present scalable digital predistortion system 10 is presented in FIG. 2. In fact, in the present scalable DPD system 10, the average power and the bandwidth of the input signal are sensed. The average power is used to select the appropriate memoryless LUT from the look-up tables bank, and the bandwidth information is used to select the parameters (memory depth and nonlinearity order) of the memory polynomial function. Once the memoryless LUT that corresponds to the operating average input power is loaded, the input and output characteristics of the cascade made of the memoryless LUT and the power amplifier are measured. This data can be used to derive and update the coefficients of the memory polynomial function without any need for data de-embedding.

Referring to FIG. 1, once the signal $x_{in\_DPD}$ is initially received, an average power of the signal is estimated. This may be performed by receiving L samples of the signal, measuring the power of each of the L samples, and averaging the L measured powers. It should be understood that any power-averaging technique may be used, as is well known in the art. Similarly, a bandwidth of the signal is measured, which may be accomplished by any conventional bandwidth measuring technique, as is well known in the art. From the first average power, a first memoryless predistortion function associated with the estimated first average power of the signal is determined, based upon the memoryless look-up table bank 16, which stores a set of memoryless predistortion functions indexed by average power values. The memoryless look-up table bank 16 is stored in computer readable memory.

A memory look-up table bank is stored in computer readable memory, and the memory look-up table bank includes sets of parameters associated with a memory polynomial function. Preferably, these parameters are the nonlinearity order and the memory depth, and are indexed in the memory look-up table bank by bandwidth. The measured bandwidth is used to determine the nonlinearity order and the memory depth of the memory polynomial predistortion function. The memory polynomial predistortion function is applied to the signal $x_{in\_DPD}$ to generate a first modified signal. The memoryless predistortion function from the memoryless look-up table bank 16 is applied to the signal to generate a second modified signal. Specifically, the signal sample at the output of the memoryless look-up table bank 16 is calculated by multiplying the signal sample at the input of the memoryless look-up table bank 16 by the memoryless predistortion complex gain read from the memoryless look-up table bank 16. The signal sample at the output of the memoryless look-up table bank 16 is converted from digital to analog and up-converted around the RF carrier frequency before being applied at the input of the power amplifier to produce the final output of the amplifier.

A portion of the power amplifier output is fed back to update the memory polynomial predistortion function, if needed. This portion is first frequency down-converted, then digitized (i.e., converted from analog to digital). A set of coefficients of the memory polynomial function based on the nonlinearity order, the memory depth, the first modified signal and the amplified signal are then estimated. With the coefficients, the memory depth and the nonlinearity order, the memory polynomial function is a completely defined function and can then be applied to the signal to generate the first modified signal. At the initialization stage, the memory polynomial function are set to the identity function (i.e., the output is the same as the input).

With regard to estimation of the coefficients of the memory polynomial function, any suitable technique may be used, such as the Moore-Penrose pseudo-inverse technique, or such algorithms as the least mean square (LMS) algorithm and its variants, or the recursive least square (RLS) algorithm and its variants. With regard to the Moore-Penrose pseudo-inverse method, the memory polynomial is given by:

$$x_{out_{MP}}(n) = \sum_{i=1}^{N} \sum_{j=0}^{M} a_{ij} \cdot x(n-j) \cdot |x(n-j)|^{i-1}, \quad (1)$$

where $x(n)$ and $x_{out_{MP}}(n)$ are the input and output signals of a memory polynomial at instant n, respectively, N is the nonlinearity order, M is the memory depth, and $a_{ij}$ are the coefficients to be estimated. This model of the memory polynomial function can be written in matrix format as:

$$x_{out_{MP}}(n) = \phi_{MP}(n) \cdot A, \quad (2)$$

where $x_{out_{MP}}(n)$ is the output of the memory polynomial function at instant n, $\phi_{MP}(n)$ is a vector built using the memory polynomial input samples, and A is the vector containing the memory polynomial coefficients. $\phi_{MP}(n)$ and A are defined as:

$$\varphi_{MP}(n) = \begin{bmatrix} x(n) & \ldots & x(n) \cdot |x(n)|^{N-1} & \ldots & x(n-1) \cdot |x(n-1)|^{N-1} & \ldots \\ & & \ldots & x(n-M) \cdot |x(n-M)|^{N-1} & & \end{bmatrix} \quad (3)$$

$$A = [a_{10} \ldots a_{N0} a_{11} \ldots a_{N1} \ldots a_{NM}]^T, \quad (4)$$

where $[\ ]^T$ denotes the matrix/vector transpose operator.

The identification of the memory polynomial model can be formulated by considering K samples according to:

$$X_{outMP} = X \cdot A, \quad (5)$$

where $X_{outMP} = [x_{outMP}(n) x_{outMP}(n-1) \ldots x_{outMP}(n-K+1)]^T$, and is the vector of K samples of the output signal. X is a matrix whose rows are delayed versions of $\phi_{MP}(n)$, and it is given by:

$$\begin{bmatrix} x(n) & \ldots & x(n) \cdot |x(n)|^{N-1} & \ldots & x(n-M) \cdot |x(n-M)|^{N-1} \\ x(n-1) & \ldots & x(n-1) \cdot |x(n-1)|^{N-1} & \ldots & x(n-M-1) \cdot |x(n-M-1)|^{N-1} \\ \vdots & \ddots & \vdots & \ddots & \vdots \\ x(n-K+1) & \ldots & x(n-K+1) \cdot |x(n-K+1)|^{N-1} & \ldots & x(n-M-K+1) \cdot |x(n-M-K+1)|^{N-1} \end{bmatrix}.$$

Using the Moore-Penrose pseudo inverse technique, the coefficients vector A is calculated as:

$$A = \text{pinv}(X) \cdot X_{outMP}, \quad (6)$$

where $\text{pinv}(X) = (X^T X)^{-1} X^T$.

As noted above, the LMS or RLS algorithms may also be used to calculate the coefficients. These techniques may be used to identify the vector A from equation (5) by minimizing the mean squared error defined as $e = \|X_{outMP} - XA\|^2$.

The scalable behavioral model, as described in FIG. 3, demonstrates how the signal characteristics are used in a manner similar to that described for digital predistortion applications. The signal's average power is used to select the memoryless nonlinear function from a set of predefined functions, while the signal bandwidth is used to determine the dimension of the dynamic nonlinear function. The dimension of the dynamic nonlinear function, the output of the memoryless nonlinear function and that of the power amplifier (or device under test (DUT), in general) are used to identify the coefficients of the dynamic nonlinear function represented by a memory polynomial function.

Conventional digital predistortion systems require a full update of the model coefficients following any change in the operating signal characteristics. For example, in the reverse twin-nonlinear two-box model, both the LUT and memory polynomial functions are updated whenever the signal average power or bandwidth change. However, the scalable digital predistortion scheme described herein can be updated using a low complexity update procedure. For this, three cases are distinguished. The first case is when a change in the operating bandwidth occurs while the operating average power remains unchanged. The second case corresponds to the situation where the average power of the input signal changes while its bandwidth remains constant. Finally, if both the average power and the bandwidth of the input signal change, this will give rise to the third alternative.

In the first case where only the bandwidth of the signal changes, the size of the memory polynomial function is updated and the memory polynomial coefficients are identified. The LUT function remains unchanged, since the operating average power did not change. The memory polynomial and LUT functions are used here as an example, yet they can be replaced in the general case by the dynamic distortions function and memoryless distortions function, respectively.

In the second case, where the average power of the signal changes but not its bandwidth, the appropriate LUT corresponding to the new average power is loaded, and the coefficients of the memory polynomial function are identified. The memory polynomial and LUT functions are used here as an example, yet they can be replaced in the general case by the dynamic distortions function and memoryless distortions function, respectively.

If both the average power and bandwidth of the input signal change, the scalable digital predistortion system is updated according to the new operating average power and applying the appropriate LUT. Then, the dimensions of the memory polynomial function are selected according to the new operating bandwidth, and waveforms at the input and output of the memory polynomial function are derived. Finally, the memory polynomial coefficients are identified. The memory polynomial and LUT functions are used here as an example, yet they can be replaced in the general case by the dynamic distortions function and memoryless distortions function, respectively.

The behavior of power amplifiers with memory is commonly separated into a combination of static distortions and dynamic distortions. The static distortions are represented by the memoryless AM/AM and AM/PM characteristics (where AM is amplitude modulation and PM is phase modulation), while the dynamic distortions are represented by a sub-model that reproduces the memory effects. This separability of static and dynamic distortions is beneficially used in two-box based predistorters such as the Wiener, Hammerstein, and twin-nonlinear predistorters.

To come up with the appropriate scalable predistorter architecture, it is essential to understand the sensitivity of the power amplifier behavior to the input signal characteristics. Thus, the memoryless AM/AM and AM/PM characteristics of the device under test (DUT) were derived over a wide range of operating conditions. Indeed, the DUT was characterized with signals having bandwidths of 5, 10, 20 and 30 MHz. For each bandwidth, the input power level was swept over 11 values for input power back off (IPBO) levels varying from 0 to 10 dB. Here, the input power back off is given by:

$$\text{IPBO} = P_{sat,in} - P_{pk,in}, \quad (7)$$

where $P_{sat,in}$ is the maximum power level that can be applied at the input of the device under test, and $P_{pk,in}$ is the peak power level of the input signal.

The DUT was characterized using the input and output complex baseband waveform technique. The memoryless AM/AM and AM/PM characteristics were derived from the raw measurements using the exponentially weighted moving average algorithm. The averaging technique used to derive the AM/AM and AM/PM characteristics is not restricted to the exponentially weighted moving average algorithm.

Figure 5:
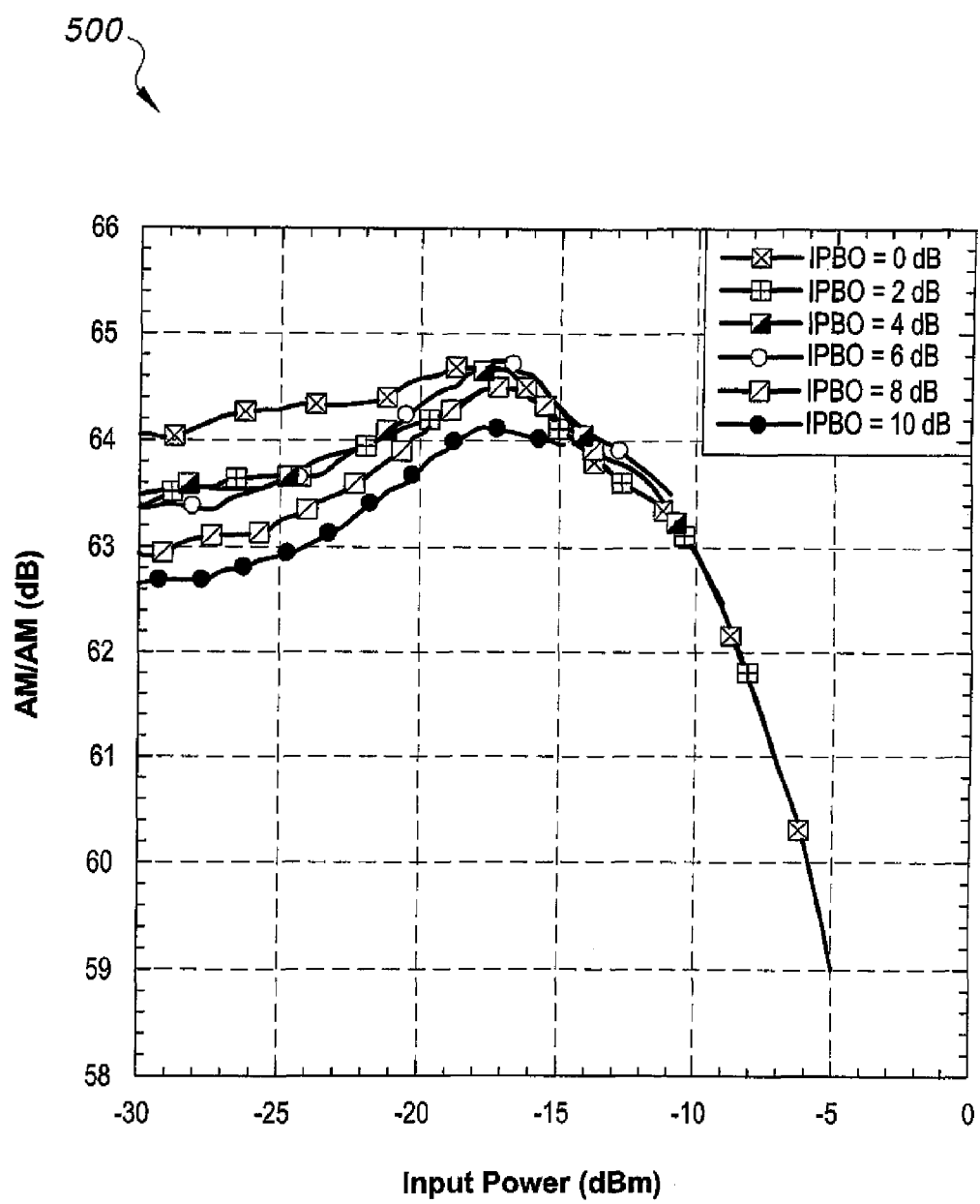
FIG. 5 is a plot of the memoryless characteristics of the device under test (DUT) for AM/AM characteristics in a scalable digital predistortion system according to the present invention.
Figure 6:
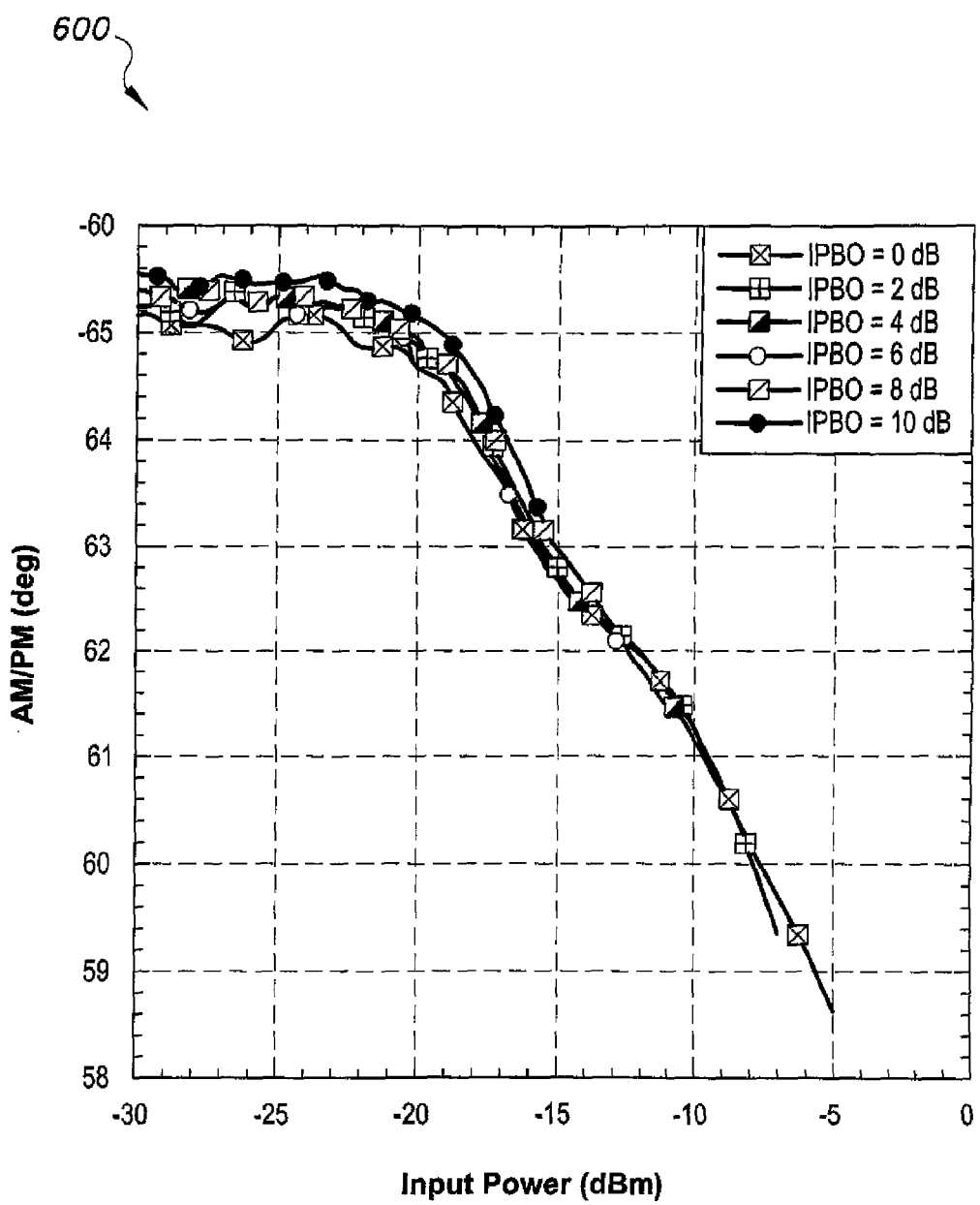
FIG. 6 is a plot of the memoryless characteristics of the DUT for AM/PM characteristics in a scalable digital predistortion system according to the present invention.
Figure 7:
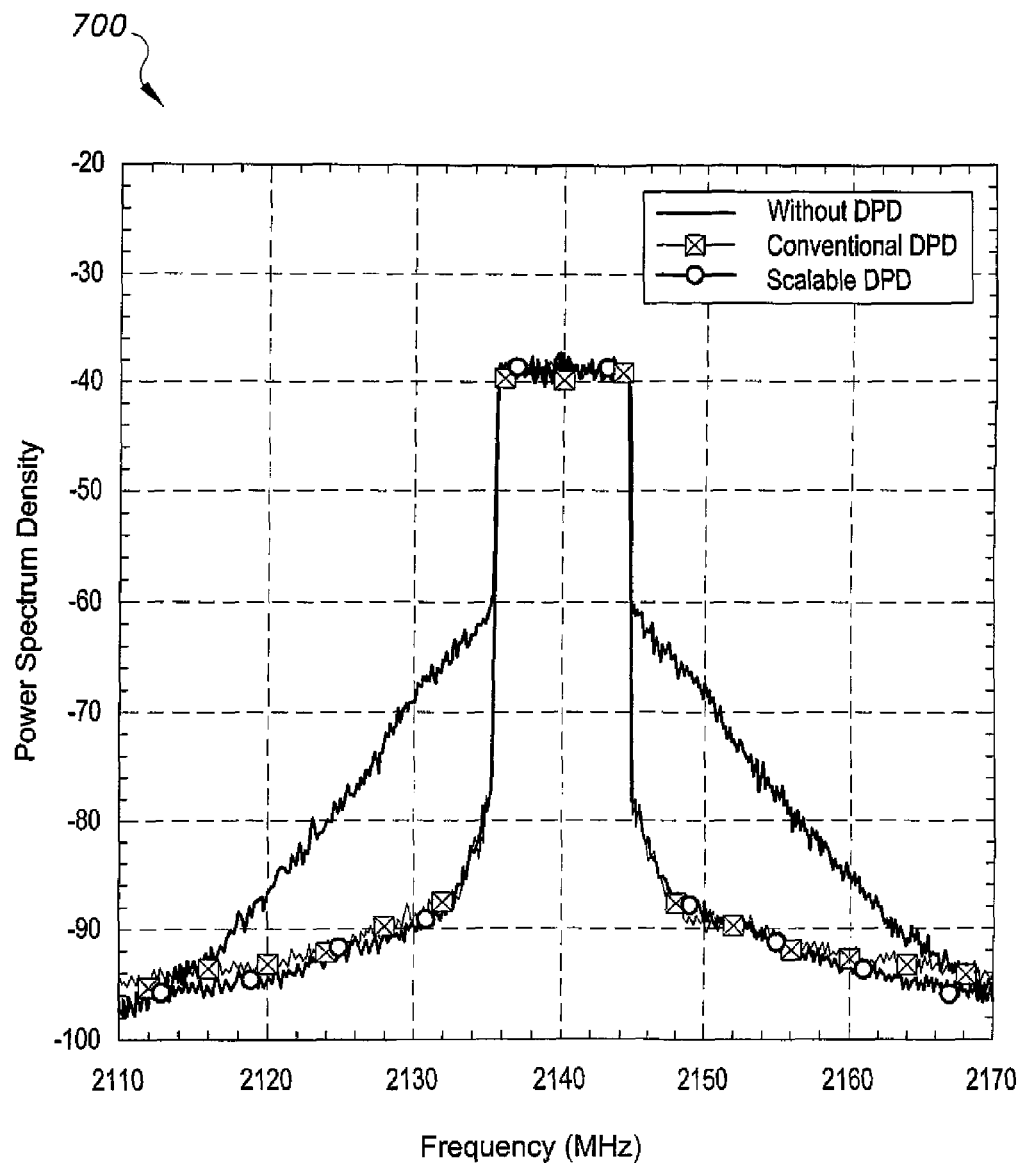
FIG. 7 is a comparative output spectral plot for a scalable digital predistortion system for a signal bandwidth of 10 MHz according to the present invention.
Figure 8:
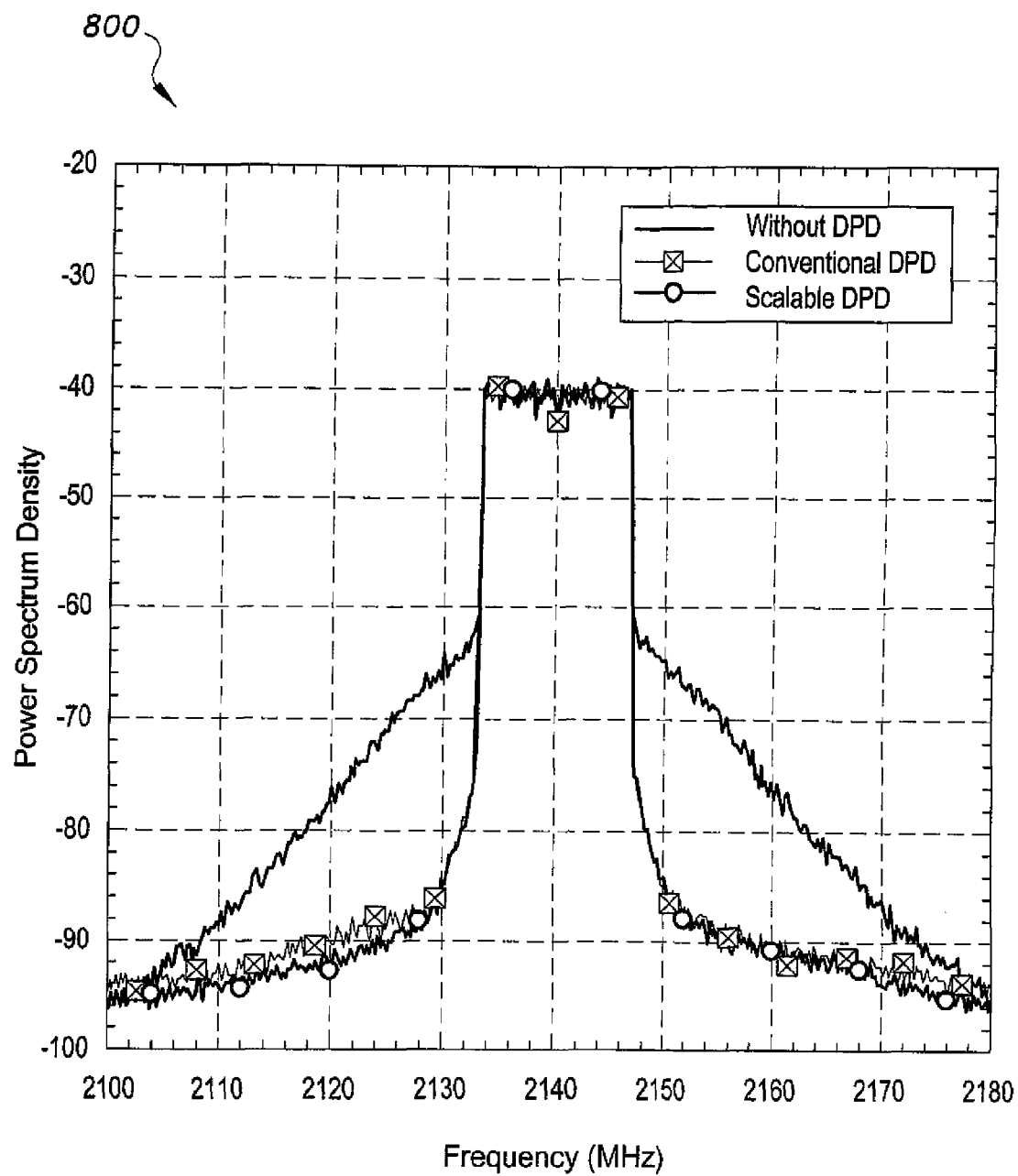
FIG. 8 is a comparative output spectral plot for a scalable digital predistortion system for a signal bandwidth of 15 MHz according to the present invention.
Figure 9:
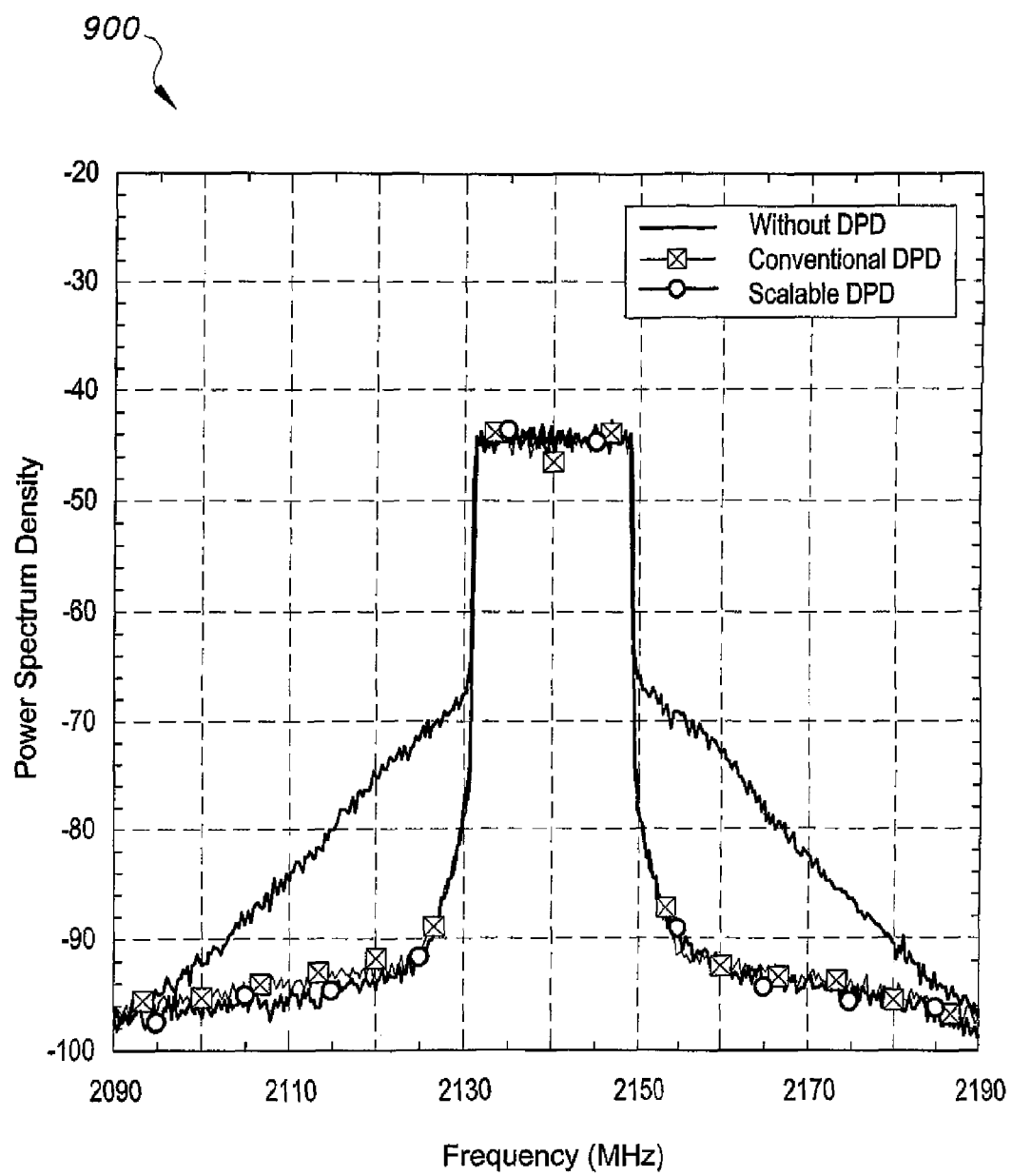
FIG. 9 is a comparative output spectral plot for a scalable digital predistortion system for a signal bandwidth of 20 MHz according to the present invention.
Figure 10:
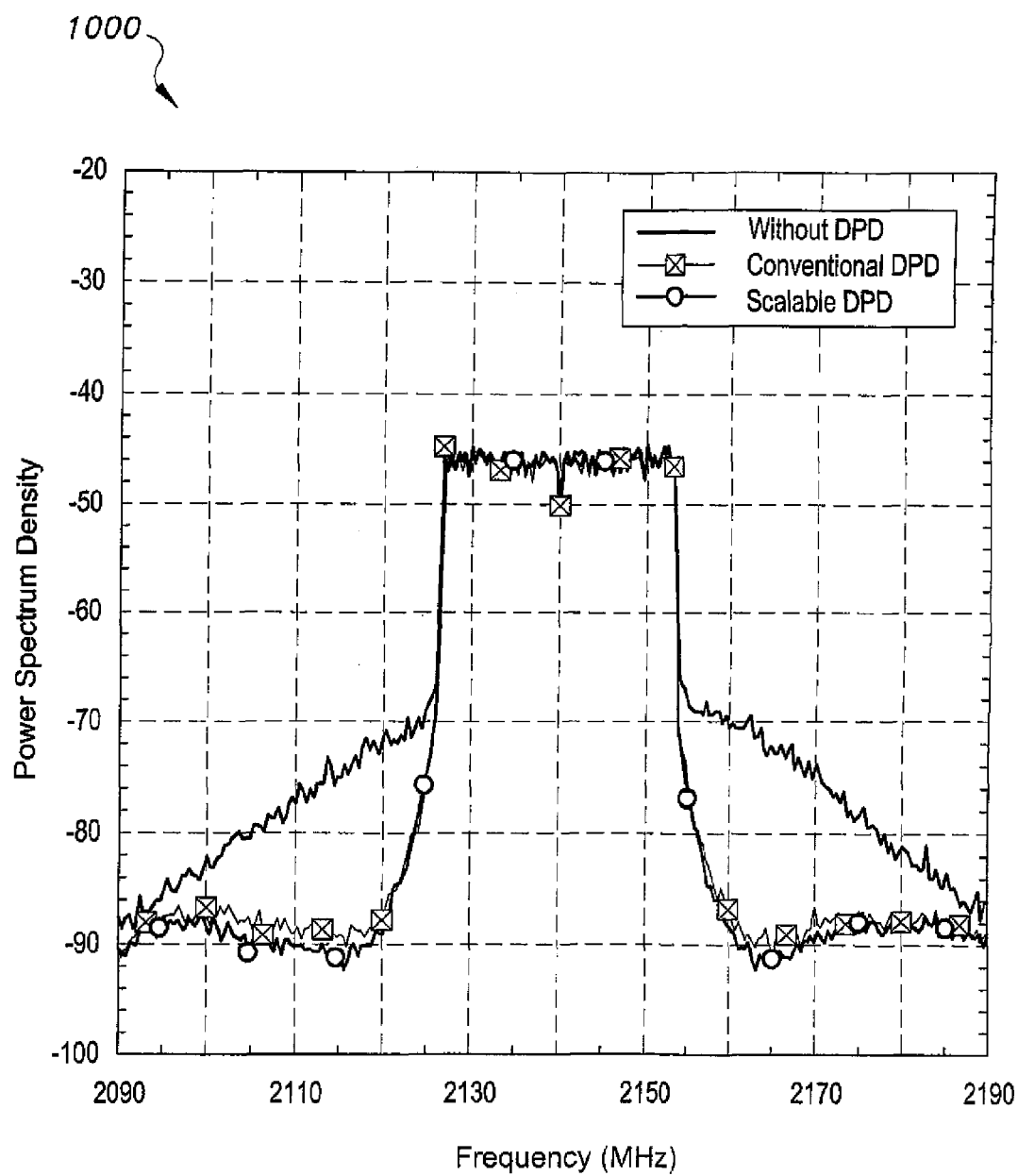
FIG. 10 is a comparative output spectral plot for a scalable digital predistortion system for a signal bandwidth of 30 MHz according to the present invention.

As shown in FIGS. 5 and 6, the memoryless AM/AM and AM/PM characteristics of the DUT for various operating average power levels are plotted in plots 500 and 600, respectively. The measurements were performed using a 5 MHz signal. FIGS. 5 and 6 illustrate power amplifier memoryless distortion sensitivity vs. the operating average power. Similar results were obtained for the measurements performed with signals having wider bandwidths. Accordingly, it appears that the static distortions of the DUT are sensitive to the input signal's average power. However, the static distortions are quasi-insensitive with respect to the bandwidth of the input signal.

The scalable digital predistortion system 10 was experimentally validated using a 300-Watt Doherty power amplifier operating in the 2110-2170 MHz frequency band. A standard compliant LTE signal was generated using Advanced Design System (ADS) Software, from Agilent Technologies, Santa Clara, Calif. The signal's bandwidth was varied from 5 MHz to 30 MHz. The characterization procedure was performed using the system described in FIG. 4. The digital waveform is downloaded into the arbitrary waveform generator that feeds the power amplifier line-up with the corresponding RF signal centered around 2140 MHz. The amplifier's output is attenuated, then down-converted and digitized using the vector signal analyzer. The input and output waveforms are processed within the measurement control computer to synthesize the digital predistortion function.

First the memoryless LUT digital predistorters were generated for five operating power levels for IPBO spanning from 0 to 4 dB using the 5 MHz signal. Then, the operating IPBO was set to 0 dB to operate the PA at full power capabilities. The IPBO was maintained to 0 dB and the bandwidth of the input signal was varied to 10 MHz, 15 MHz, 20 MHz, and 30 MHz, successively. For each bandwidth, the scalable DPD was derived by maintaining the same look up table (corresponding to IPBO=0 dB) and identifying the memory polynomial function. The amplifier was also linearized for IPBO=0 dB, and the considered bandwidths using the conventional approach in which the entire reverse twin-nonlinear DPD was identified for each test condition. The measured spectra at the output of the power amplifier with both the conventional reverse twin-nonlinear two-box DPD and the proposed scalable DPD are plotted in plots 700 through 1000 of FIGS. 7 through 10, respectively. The measured spectra at the output of the power amplifier before predistortion are also shown in the same figures. These results show a quasi-perfect cancellation of the PA's distortions for bandwidths up to 20 MHz, and some residual distortion for the measurements performed with the 30 MHz signal. This is mainly due to the bandwidth limitations of the measurement setup, which cannot exceed 100 MHz, both in the signal generation and analysis paths. This limits the signal bandwidth to 20 MHz when up to the fifth-order intermodulation products are considered.

Most importantly, the results shown in plots 700 through 1000 demonstrate the ability of the scalable digital predistortion system 10 to achieve similar and even slightly better performance than the conventional reverse twin-nonlinear two-box DPD. Yet, the present DPD has significantly less computational complexity for the identification of the DPD coefficients. To evaluate the complexity reduction obtained by using the proposed scalable predistorter, the number of coefficients to be updated for each bandwidth was calculated for both the conventional twin-nonlinear two-box predistorter and the proposed scalable predistorter. The results are summarized in Table 1. In these calculations, the LUT was considered to be equivalent to a twelfth-order polynomial function. In fact, this represents a fair estimation for highly nonlinear Doherty power amplifiers with AM/AM and AM/PM characteristics similar to those of the DUT tested. The complexity reduction refers to the ratio between the number of coefficients in the LUT and the total number of coefficients in the model. Indeed, the number of LUT coefficients represents the number of parameters that do not need to be identified in the proposed scalable DPD. According to the results presented in Table 1, the complexity reduction varies between 37.5% and 54.5%. This significant complexity reduction is achieved without performance degradation, as shown in plots 700-1000.

TABLE 1

Complexity Reduction Using the Proposed DPD

| Bandwidth in MHz | 10 | 15 | 20 | 30 |
|---|---|---|---|---|
| LUT number of coefficient | 12 | 12 | 12 | 12 |
| Memory polynomial size | 10 | 10 | 15 | 20 |
| DPD total number of coefficients | 22 | 22 | 27 | 32 |
| Number of DPD coefficients to be updated (conventional/proposed) | 22/10 | 22/10 | 27/15 | 32/20 |
| Complexity reduction | 54.5% | 54.5% | 44.4% | 37.5% |

To further evaluate the effectiveness of the present DPD architecture in terms of power scalability, it was applied for the linearization of the device under test while operating at various IPBO and bandwidths. The measured performances for a signal bandwidth of 20 MHz produced similar results, which corroborated the findings shown in plots 700-1000, according to which the present scalable predistorter achieves performance similar to the conventional architecture, while reducing the computational complexity. Similar performances were obtained for all bandwidths considered.

Experimental validation demonstrated the ability of the present scalable predistorter architecture to compensate for the distortions generated by the power amplifier for various signal bandwidths and power levels. The present predistorter requires the identification of much fewer coefficients than its conventional counterpart, while achieving the same performance.

For behavioral modeling applications, the present generic bandwidth-scalable behavioral models were benchmarked against the performance of corresponding conventional counterparts. Thus, the present bandwidth-scalable Hammerstein model (where the static nonlinear function is made bandwidth-independent) is compared to a conventional Hammerstein model (where the static nonlinear function is bandwidth-dependent). Similarly, the bandwidth-scalable forward twin-nonlinear two box (FTNTB) model is compared to its conventional version.

First, the conventional Hammerstein and FTNTB models were identified. For both models, the memory depth was set to 4 for the 30 MHz wide signal, and to 5 for the 40 MHz wide signal. For the FTNTB model, the nonlinearity order of the memory polynomial function modeling the dynamic distortions was set to 5 for both signals. Then, the bandwidth-scalable models having the same size as their conventional counterparts were identified. For these models, the static distortion characteristic used was that measured using the 5 MHz test signal. Table 2 reports the calculated NMSE for the four models. These results show that for the structures tested (the Hammerstein and the FTNTB models), the conventional and the bandwidth-scalable versions lead to comparable NMSE performance for both test signals. This clearly shows that the present approach does not lead to any degradation in the model performance. To further investigate this, the memory depth of the models was varied from 1 to 10 and the nonlinearity order of the memory polynomial function used in the FTNTB model was varied from 1 to 6. For each set of dimensions, the conventional and bandwidth-scalable models were derived, and the NMSE variation was calculated for each set of nonlinearity order and memory depth according to:

$$\Delta NMSE = |NMSE_{Conventional} - NMSE_{BandwidthScalable}|, \quad (8)$$

where $NMSE_{Conventional}$ and $NMSE_{BandwidthScalable}$ are the NMSE calculated for the conventional and the bandwidth-scalable models, respectively. The results show that the NMSE variation does not exceed 0.27 dB. This further shows that both the conventional and bandwidth scalable models lead to similar performance.

TABLE 2

Comparison of NMSE for Conventional and Bandwidth-Scalable Models

| | | Signal Bandwidth | |
|---|---|---|---|
| Models | | 30 MHz | 40 MHz |
| Hammerstein | Conventional | −32.74 dB | −32.61 dB |
| | Bandwidth Scalable | −32.68 dB | −32.57 dB |
| FTNTB | Conventional | −34.82 dB | −35.80 dB |
| | Bandwidth Scalable | −34.77 dB | −36.04 dB |

To evaluate the gain in complexity reduction achieved by using the proposed bandwidth-scalable models, the number of coefficients will be considered. In two-box models, the static nonlinear function is commonly implemented using a look-up table, yet it can be considered as a polynomial function of order (K). The function modeling the dynamic distortions is a simple finite impulse response (FIR) filter of order M for Hammerstein models, and a memory polynomial function of size M×N for the twin-nonlinear two-box model. Herein, M represents the memory depth and N is the nonlinearity order of the polynomial function used in the FTNTB model. Thus, the total number of parameters (S) of the model is given by:

$$S = K + (N \times (M+1)), \quad (9)$$

where N=1 for the Hammerstein model.

Accordingly, in the present bandwidth scalable behavioral models, the number of parameters that will be updated is (M+1) for the Hammerstein model, and (N×(M+1)) for the FTNTB model.

Typically, K ranges between 10 and 14 for highly efficient nonlinear Doherty power amplifiers. An average value of 12 was used to estimate the number of coefficients needed for the static nonlinear function of all models. The number of coefficients that needs to be updated once the signal bandwidth is changed from 5 MHz to 30 MHz and 40 MHz are reported in Table 3. Hence, the bandwidth-scalable Hammerstein model reduces the number of coefficients to be updated by 70% to 75%, while the complexity reduction is in the range of 30% to 45% for the bandwidth-scalable FTNTB model. From Eq. (9), it can be seen that as the memory effects present in the DUT decrease, the complexity reduction gained by the use of the proposed bandwidth-scalable models increases.

TABLE 3

Parameters to be Updated

| | | Signal Bandwidth | |
|---|---|---|---|
| Models | | 30 MHz | 40 MHz |
| Hammerstein | Conventional | 164 | 175 |
| | Bandwidth-Scalable | 4 | 5 |
| FTNTB | Conventional | 32 | 37 |
| | Bandwidth-Scalable | 20 | 25 |

According to the data analysis presented above, the present scalable behavioral models and digital predistorters can achieve performance similar to state of the art behavioral models and digital predistorters, while requiring the update of a much fewer number of coefficients. This makes the present digital predistorter suitable for use in modern communication systems, where the signal characteristics, including the average power and bandwidth, can dynamically vary at a high rate, as in the case of long term evolution (LTE) communication systems. The present structures combine two highly sought features, which are performance and low complexity.

As noted above, it should be understood that the calculations may be performed by any suitable computer system, or by a digital signal processor. Data is entered into system via any suitable type of user interface, and may be stored in memory, which may be any suitable type of computer readable and programmable memory and is preferably a non-transitory, computer readable storage medium. Calculations may be performed by a processor, which may be any suitable type of computer processor.

The processor may be associated with, or incorporated into, any suitable type of computing device, for example, a personal computer or a programmable logic controller. The processor, the memory and any associated computer readable recording media are in communication with one another by any suitable type of data bus, as is well known in the art. Examples of computer-readable recording media include non-transitory storage media, a magnetic recording apparatus, an optical disk, a magneto-optical disk, and/or a semiconductor memory (for example, RAM, ROM, etc.). Examples of magnetic recording apparatus that may be used in addition to the memory, or in place of the memory, include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. It should be understood that non-transitory computer-readable storage media include all computer-readable media, with the sole exception being a transitory, propagating signal. As a practical matter, the algorithms described herein would typically be performed in circuits utilizing digital signal processors (DSPs) and/or field programmable gate arrays (FPGAs).

It is to be understood that the present invention is not limited to the embodiments described above, but encompasses any and all embodiments within the scope of the following claims.

I claim:

1. A scalable digital predistortion method for linearizing a power amplifier, comprising the steps of:
    establishing a memoryless look-up table bank stored in computer readable memory, the memoryless look-up table bank having a set of memoryless predistortion functions stored therein indexed by average power values;
    storing memory polynomial size parameters indexed by bandwidth in the computer readable memory, the size parameters including nonlinearity order and memory depth;
    receiving a signal;
    estimating an average power of the signal;
    measuring bandwidth of the signal;
    determining a nonlinearity order and a memory depth of a memory polynomial function associated with the bandwidth of the signal from the memory polynomial size parameters stored in the computer readable memory;
    applying the memory polynomial function to the signal to generate a first modified signal;

determining a memoryless predistortion function associated with the estimated average power of the signal from the memoryless look-up table bank;
applying the memoryless predistortion function to the first modified signal to generate a second modified signal;
inputting the second modified signal to a power amplifier to produce an amplified signal;
outputting the amplified signal from the power amplifier; and
estimating a set of coefficients of the memory polynomial function based on the nonlinearity order, the memory depth, the first modified signal and the amplified signal to define the memory polynomial function.

2. The scalable digital predistortion method for linearizing a power amplifier as recited in claim 1, wherein the step of estimating the average power of the signal comprises:
receiving L samples of the signal;
measuring the power of each of the L samples; and
averaging the L measured powers.

3. The scalable digital predistortion method for linearizing a power amplifier as recited in claim 1, wherein the step of estimating the set of coefficients of the memory polynomial function comprises applying the Moore-Penrose pseudo-inverse method.

4. The scalable digital predistortion method for linearizing a power amplifier as recited in claim 1, further comprising the steps of:
converting the second modified signal from digital to analog; and
up-converting the second modified signal around a carrier frequency of the signal.

5. The scalable digital predistortion method for linearizing a power amplifier as recited in claim 4, further comprising the steps of:
down-converting the amplified signal; and
converting the amplified signal from analog to digital.

* * * * *